United States Patent [19]

Mertesdorf

[11] Patent Number: 5,863,701
[45] Date of Patent: Jan. 26, 1999

[54] POLYMERS CONTAINING PROTECTED STYRENE AND UNPROTECTED HYDROXBENZYL (METH) ACRYLAMIDES

[75] Inventor: Carl-Lorenz Mertesdorf, Bad Krozingen, Germany

[73] Assignee: Olin Microelectronic Chemicals, Inc., Norwalk, Conn.

[21] Appl. No.: 72,541

[22] Filed: May 5, 1998

Related U.S. Application Data

[62] Division of Ser. No. 548,421, Oct. 26, 1995, Pat. No. 5,780,566.

[30] Foreign Application Priority Data

Oct. 26, 1994 [CH] Switzerland .............................. 3202/94
Oct. 27, 1994 [CH] Switzerland .............................. 3220/94

[51] Int. Cl.$^6$ ....................................................... G03C 1/492
[52] U.S. Cl. ..................................... 430/270.1; 430/283.1
[58] Field of Search ................................ 430/270.1, 283.1

[56] References Cited

U.S. PATENT DOCUMENTS 5,328,973  7/1994  Roeschert et al. ...................... 526/262

*Primary Examiner*—Mark Chapman
*Attorney, Agent, or Firm*—Ohlandt, Greeley, Ruggiero & Perle

[57] ABSTRACT

Novel polymers may be used in resist formulations for the fabrication of printing plates and circuit boards and, in particular, for the fabrication of integrated circuits. No autocatalytic decomposition of the compounds occurs and the resist film obtained therewith has good adhesive properties.

5 Claims, No Drawings

POLYMERS CONTAINING PROTECTED STYRENE AND UNPROTECTED HYDROXBENZYL (METH) ACRYLAMIDES

This is a division of application Ser. No. 08/548,421 filed Oct. 26, 1995 now U.S. Pat. No. 5,780,566.

The present invention relates to novel polymers based on N-hydroxybenzyl(meth)acryl-amides, to a process for their preparation and to the use thereof, in particular in resist formulations, for coating printed circuit boards, printing plates and, more particularly, for fabricating integrated circuits.

The fabrication of highly integrated semiconductor components in microelectronics, as for example of memory chips (DRAMS), requires photoresists of high-resolution for structuring. The integration density is essentially governed by the resolution capacity of the photoresist. In addition to having high resolution, a suitable photoresist must have further useful physical and chemical properties such as high thermal stability, a high softening temperature, good etch resistance and, most particularly, good adhesion, in order to meet all demands that are made of such a photoresist system in the individual process steps of semiconductor production.

The resist formulations mainly used at the present time are those that produce a positive image of the masks used for structuring and work on the basis of diazonaphthoquinone/-novolak resist formulations. Compounds containing diazonaphthoquinone groups inhibit the solubility of the novolak binder resin in aqueous-alkaline developers and, when exposed to light of the appropriate wavelength, undergo rearrangement to compounds containing indenecarboxyl groups (Wolf rearrangement) that are then no longer able to inhibit the solubility of the novolak, but accelerate and increase it.

The resolution capacity of a photoresist is proportional to the wavelength of the irradiating light employed, the limit of the physical resolution possible having been reached with the currently required resolution of 0.35 μm with the aforementioned diazonaphthoquinone/-novolak systems (at 365 nm). For this reason, increasing interest is being focused on those photoresists that work at shorter wavelengths in the deep UV range (200 to 300 nm). Novolaks absorb in this range so strongly that uniform exposure over a standard layer thickness of c. 1.0 μm is not possible. To ensure the required optical transparency, it is common practice to use poly(p-hydroxystyrene) or the derivatives thereof as binder resins for resists that work in the deep UV range.

As the light intensity of the radiation sources at 200–300 nm is lower than the intensity at longer wavelenth (e.g. i-line: 365 nm), photoresists that have a high photosensitivity are needed.

As is common knowledge, the high photosensitivity is achieved by blocking the alkali-solubilising functional groups, typically hydroxyl, carboxyl, amino and imide groups, by acid-labile protective groups, thereby making the polymer substantially alkali-insoluble. Subsequent exposure by means of a photoacid generator that absorbs at the appropriate wavelength effects formation of a strong acid which, in a subsequent heat treatment step (post-exposure bake), leads to removal of the protective groups and hence to a back-formation of the solubilising groups. As the proton is regenerated in the cleavage reaction and is able to catalyse further deprotection cycles, which makes possible a high sensitivity, the term "chemically amplified photoresists" is applied to such systems.

An illustrative example of such systems is poly(p-hydroxystyrene), the phenolic HO groups of which may be protected with tert-butoxycarbonyl (t-Boc) or tetrahydropyranyl groups (THP). Photoresists that contain such binder resins have long been known and thoroughly investigated (q.v. M. J. Bowden and S. R. Turner (ed) "Electronic and Photonic Application of Polymers", ACS Series, 218, Washington, 1988; H. Ito et al., Polym. Eng. Sci. 23, (1983), 1012–1018, and N. Hayashi et al., J. Appl. Polym. Sci., 42 (1991), 877–883; as well as Polymer, 33, (1992), 1583–1588).

Photoresist films that contain completely protected binder resins of the above type have, however, shortcomings, as for example, poor adhesion to silicon (K. Przybilla et al., SPIE Vol. 1466, Advances in Resist Technology and Processing VIII, (1991), 174–187; Polym. Eng. Sci., 32, (1992), 1516–1522; J. Photopolym. Sci. Tech., 4, (1991), 421–432), or a pronounced tendency to form cracks, which may occur in particular in the course of the development step and result in large-scale peeling of the resist film (q.v. inter alia EP-A-366590).

It is known that the presence of phenolic HO groups substantially enhances adhesion and ensures defect-free developability (EP-A-366590). Copolymers having free phenolic monomer units, however, suffer from a loss of heat stability. The thermally induced decomposition (autocatalysis) is attributable to a partial deprotection reaction resulting from the catalytic influence of the weakly acidic phenolic HO group if said group is situated in the direct vicinity of a protected monomer unit (H. Ito, J. Polym. Sci., Part A, 24, (1986), 2971–2980; P. J. Paniez et al, SPIEs Symposium on Microlithography (27.2.–4.3 1994, 2195-03 as abstract, SPIE Vol. 2195, Advances in Resist Technology and Processing (1994), 14–27). The processing range of such materials is thereby severely limited and the result may be an undesirably high loss in resist coating thickness at unexposed areas of the photoresist.

Chemically amplified photoresists in particular are also very susceptible to the interval between exposure and the subsequent post-exposure bake (PEB). Post-exposure delays, which in sensitive systems become critical even after a few minutes, lead to a pronounced surface inhibition which, in turn, results in the formation of T-shaped denatured profiles (S. A. MacDonald et al., SPIE Vol. 1466, Advances in Resist Technology and Processing VIII, (1991), 2–7; W. D. Hinsberg et al., SPIE Vol. 1672, Advances in Resist Technology and Processing IX, (1992), 24–32; S. Chaterjee et al., Polym. Eng. Sci., 32, (1992), 1571–1577).

EP-A-541 112 postulates the use of radiation-sensitive compositions that comprise a polymer binder which is insoluble in water and soluble in aqueous alkaline solutions, and additionally a compound which, when exposed to radiation, generates a strong acid, and also an organic compound whose solubility in an aqueous alkaline developer is greatly increased by treatment with acid and which contains at least two groups that are degradable with a strong acid.

DE-A-4 126 409 discloses homo- and copolymers that contain, as monomer, inter alia a N-hydroxybenzyl(meth) acrylamide unit carrying an acid-removable group and which can be used in a radiation-sensitive composition.

Finally, Japanese patent Kokai 63-235936 and 1-102467 disclose photosensitive compositions for offset printing plates that contain, as polymer component, (meth) acrylamides.

In view of the sensitivity of a light-sensitive composition, it is particularly important to establish a suitable solubility rate of the binder resin in the aqueous-alkaline developer. The solubility rate of a binder resin, when using polyhydroxystyrene, can conveniently be established by the ratio of different hydroxystyrene isomers in the polymer. This has also been demonstrated for different isomers of hydroxyphenylmethacrylates (K. Przybilla et al., SPIE Vol. 1466, Advances in Resist Technology and Processing VIII (1991), 174–187; Polym. Eng. Sci. 32, (1992), 1516–1522, J. Photopolym. Sci. Tech. 4, (1991), 421–432; R. Dammel et al., SPIE's Symp. on Microlithography (27.2–4.3.1994, 2195-48 as abstract; SPIM Vol. 2195, Advances in Resist Technology and Processing XI (1994), 542–558).

The position of the phenolic hydroxyl group also has a strong effect on the extent of the solubility inhibition of a phenolic binder resin in an aqueous-alkaline developer and determines the difference in solubility of a light-sensitive composition between exposed and unexposed areas and hence the lithographic contrast (T. Hattori et al., Japanese Journal of Appl. Phys. 30, Nr. 11B, (1991), 3125–3131).

The preparation of the monomers in DE-A-4 126 409 is effected, however, by a process that yields either mixtures of isomers or phenol which is polysubstituted in the nucleus by N-methylmethacrylamide units (q.v. also EP-A-347 660). To obtain pure isomers of N-hydroxybenzyl(meth)acrylamide it is necessary to resolve the mixture by column chromatography over silica gel. The formation of mixtures of isomers or polysubstituted phenols, and the purification thereof involved, can only be avoided by using phenols in which some of the 2- and 4-positions activated with regard to an electrophilic substitution reaction are already substituted (as e.g. 2,6-dimethylphenol).

N-Hydroxybenzyl(meth)acrylamides, which are used to synthesise the novel polymers, can be readily obtained in the process of this invention as pure isomers. The solubility rate of poly-N-hydroxybenzyl(meth)acrylamides in aqueous-alkaline developer is readily controllable, as in the case of polyhydroxystyrenes and polyhydroxyphenylmethacrylates, by means of the ratio of the monomer units.

This invention has for its object to provide compounds that do not have the drawbacks in resist films discussed above and, in particular, which have good adhesion to the substrate, typically a silicon wafer, and good photosensitivity, and whose solubility rates are controllable in an aqueous-alkaline developer, and which in addition can be readily used in the deep UV range and which, first and foremost, are not subject to autocatalytic decomposition and have no tendency to form cracks.

Surprisingly, it has now been found that polymers synthesised from N-hydroxybenzyl-(meth)acrylamides, as well as the photoresist formulations based thereon, in addition to having the advantages stated in DE-A-4 126 409, including very high optical transparency in the wavelength from 200 to 300 nm and good adhesion to silicon, despite the presence of free phenolic HO groups, are not subject to autocatalytic decomposition.

Accordingly, the invention provides novel polymers having a molecular weight of $10^3$ to $10^6$, determined by gel permeation chromatography, comprising, based on the total amount of structural units present in the polymer, 90 to 10 mol % of the structural repeating unit of formula Ia

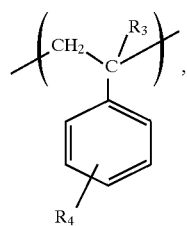

90 to 10 mol % of the structural repeating unit of formula Ib,

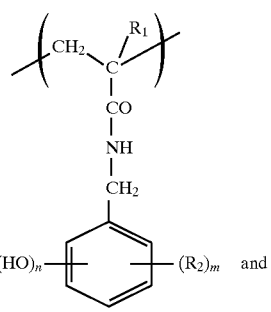

0 to 40 mol % of the structural repeating unit of formula Ic

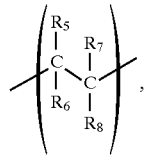

wherein
  $R^1$ is H, $C_1$–$C_4$alkyl, halo-$C_1$–$C_4$alkyl, halogen or CN,
  $R_2$ is independently H, $C_1$–$C_4$alkyl, $C_1$–$C_4$alkoxy or halogen,
  $R_3$ is H or $CH_3$,
  $R_4$ is a group containing an acid-removable O—C— or O—Si bond,
  $R_5$ is H or $CH_3$,
  $R_6$ is H, COOH or CN,
  $R_7$ is H or $CH_3$,
  $R_8$ is H, CN, COOH, $COOR_{10}$ or aryl,
  $R_{10}$ is $C_{1-C6}$alkyl,
  n is 1, 2 or 3, and
  m is 0, 1, 2 or 3,
and the sum of the percentages is always 100 %.

$R_1$ and $R_2$ defined as $C_1$–$C_4$alkyl may be linear as well as branched alkyl, typically methyl, ethyl-, n-and isopropyl-, n-, sec- and tert-butyl.

A $C_1$–$C_4$alkoxy group $R_2$ may typically be methoxy, ethoxy, propoxy or butoxy.

$R_1$ and $R_2$ defined as halogen are fluoro, chloro, bromo or iodo. Chloro or fluoro is preferred.

$R_4$ as a group containing an acid-removable O—C— or O—Si bond may be selected from: the groups of formulae —$(CR'_2)_p$—$COOR_9$, —O—$(CR'_2)_p$—$COOR_9$,

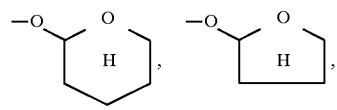

aralkoxy such as 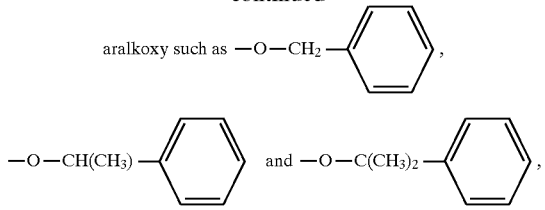, also allyloxy such as —O—CH$_2$—CH=C(CH$_3$)$_2$, or branched C$_3$–C$_6$alkoxy such as isopropoxy, sec- and tert-butoxy, isopentoxy and isohexoxy, as well as the group —O—Si(R$_{11}$)$_3$, wherein R$_{11}$ is linear or branched C$_1$–C$_4$alkyl, preferably CH$_3$.

Where R$_4$ is the group of formula —(CR'$_2$)$_p$—COO—R$_9$, or —O—(CR'$_2$)$_p$—COO—R$_9$, R$_9$ has the function of an acid-removable protective group and may be a group of formula

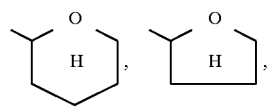

—C(CH$_3$)$_2$—OCH$_3$ or —CH(CH$_3$)—OC$_2$H$_5$, as well as aralkyl such as

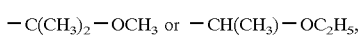 and

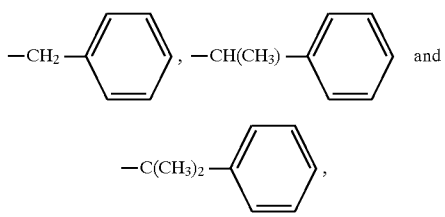

also allyl such as —CH$_2$—CH=C(CH$_3$)$_2$, or branched C$_3$–C$_6$alkyl such as isopropyl, sec- and tert-butyl, isopentyl and isohexyl, as well as —Si(R$_{11}$)$_3$, wherein R$_{11}$ is a linear or branched C$_1$–C$_4$alkyl group, preferably CH$_3$, and the symbol p is 0, 1, 2, 3 or 4 and each R' is independently H or C$_1$–C$_4$alkyl. R$_8$ defined as aryl may typically be phenyl or naphthyl, each unsubstituted or substituted by halogen, C$_1$–C$_6$alkyl, C$_1$–C$_6$alkoxy or halo-C$_1$–C$_6$alkyl.

R$_{10}$ defined as C$_1$–C$_6$alkyl may be linear as well as branched alkyl.

Preferred polymers comprise, based on the total amount of structural units present in the polymer, 90 to 20 mol % of the structural repeating unit of formula Ia, 80 to 10 mol % of the structural repeating unit of formula Ib, and 0 to 30 mol % of the structural repeating unit of formula Ic, the sum of the percentages being always 100%.

Other preferred polymers are those wherein

R$_1$ is CH$_3$,
R$_2$ is H, CH$_3$, OCH$_3$, Cl oder Br,
R$_3$ is H,
R$_4$ is a group containing an acid-removable O—C or O—Si bond of formula

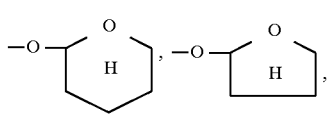

—OC(CH$_3$)$_2$—OCH$_3$ or —OCH(CH$_3$)—OC$_2$H$_5$, aralkoxy, allyloxy, C$_3$–C$_6$alkoxy or the group of formula —O—Si(R$_{11}$)$_3$, wherein R$_{11}$ is C$_1$–C$_4$alkyl, or R$_4$ is a group of formula

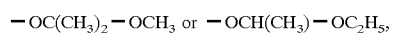

R$_9$ is an acid-removable protective group, typically aralkyl, allyl or branched C$_3$–C$_6$alkyl,
R$_5$ is H,
R$_6$ is H,
R$_7$ is CH$_3$,
R$_8$ is COOH,
R' is H or CH$_3$,
p is 0 or 1,
n is 1, and
m is 0.

Those polymers are particularly preferred wherein R$_4$ is a group of formula

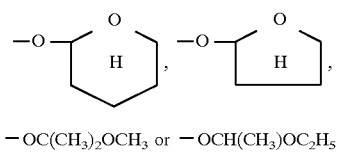

—OC(CH$_3$)$_2$OCH$_3$ or —OCH(CH$_3$)OC$_2$H$_5$, and, most preferably, those compounds wherein R$_1$ is CH$_3$,
R$_3$ is H,
R$_5$ is H and R$_6$ is H,
R$_7$ is CH$_3$,
R$_8$ is COOH,
n is 1 and m is 0, and
R$_4$ is a group of formula

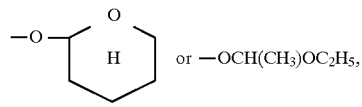 or —OCH(CH$_3$)OC$_2$H$_5$,

The polymers according to the instant invention desirably have a molecular weight of c. 2000 to 500 000, preferably of 5000 to 50 000. Terpolymers comprising the structural repeating units of formulae Ia, Ib and Ic are preferred.

The polymers are prepared in known manner, conveniently by radical or ionic polymerisation of the monomers of formulae

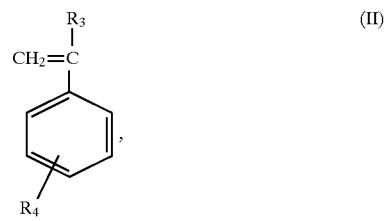

(II)

-continued

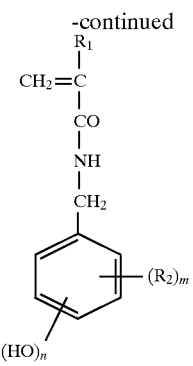

and

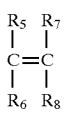

in the molar amounts of 10–90% of the monomer II and 10–90% of the monomer III, and 0–40% of the monomer IV, and $R_1$, $R_2$, $R_3$, $R_4$, $R_5$, $R_6$, $R_7$, $R_8$, m and n are as defined above.

Whereas the monomers of formulae II and IV are known and can be prepared in known manner, only some of the monomers of formula III are known. One means of preparing these monomers, especially the pure isomers, comprises treating a solution, cooled to c. 2 to 5° C., of a compound of formula

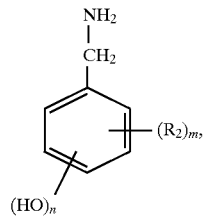

in aqueous alkali, dropwise with a suitably equimolar amount of a solution of a compound of formula

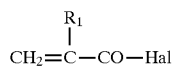

suitably in an organic solvent. In the above formulae, $R_1$, $R_2$, m and n are as defined in connection with formulae Ia, Ib and Ic, and Hal is fluoro, bromo or, preferably, chloro.

Suitable organic solvents are all solvents that are inert to the acid halide and do not react therewith. Typical examples of suitable solvents are toluene, benzene, diethyl ether and, preferably, ethyl acetate.

The reaction products are afterwards preferably recrystallised (e.g. from a mixture of water/ethanol), to give pure isomers of the compound of formula III. This mode of preparing the compound of formula III differs fundamentally from that disclosed in EP-A-0 347 660, in which a mixture of isomers of the compound of formula III is obtained by acid catalysis.

Suitable monomers of formula II are typically: 4-(2-tetrahydropyranyloxy)styrene, 4-(tert-butoxycarbonyloxy) styrene and tert-butyl (4-vinylphenoxy)acetate.

Suitable monomers of formula III are typically: N-(2- or -3- or -4-hydroxybenzyl)meth-acrylamide and N-(4-hydroxy-3-methoxybenzyl)methacrylamide.

Suitable monomers of formula IV are typically: acrylic acid, methacrylic acid, acrylo-nitrile, methacrylonitrile, fumaric acid,-maleic acid, maleates, malodinitrile and styrene.

The polymers according to the instant invention find utility in photoresist formulations for electronics (galvanoresist, etch resist, solder resist), for making printing plates such as offset plates or screen printing forms, for use in mould etching, preferably in microelectronics for fabricating integrated circuits. The recording material made from the formulation is used as mask for the succeeding process steps. These steps include etching the substrate, the implantation of ions into the substrates or the deposition of metals or other materials on the substrates. In addition, the radiation-sensitive formulation is also suitable for the fabrication of circuit boards and printing plates.

The resist formulations comprise:
a) 45 to 99.9 % by weight of a polymer according to the instant invention,
b) 0.1 to 20 % by weight of a photoactive compound (acid generator),
c) 0.01 to 40 % by weight of optional modifiers, and
d) an organic solvent.

The percentages by weight are based on the total weight of solids in the radiation-sensitive formulation. The solids content in the formulation is from 5 to 40 % by weight.

Preferred formulations are those comprising the indicated components in the following ratios: 68 to 98 % by weight of component a), 2 to 15 % by weight of component b), 0.01 to 30 % by weight of component c) and component d), the sum of components a), b) and c) being 100 % by weight.

Illustrative examples of polymers suitable for use as component a) are: a terpolymer consisting of 50 mol % of 4-(2-tetrahydropyranyloxy)styrene, 35 mol % of N-(2-hydroxybenzyl)methacrylamide and 15 mol % of methacrylic acid; a terpolymer consisting of 55 mol % of 4-(2-tetrahydropyranyloxy)styrene, 30 mol % of N-(3-hydroxybenzyl)methacrylamide and 15 mol % of methacrylic acid, also a copolymer consisting of 25 mol % of tert-butyl (4-vinylphenoxy)acetate and 75 mol % of N-(2-hydroxybenzyl)-methacrylamide; a terpolymer consisting of 25 mol % of tert-butyl (4-vinylphenoxy)acetate, 45 mol % of N-(2-hydroxybenzyl)methacrylamide and 30 mol % of N-(3-hydroxy-benzyl)methacrylamide.

The radiation-sensitive component b) is suitably preferably a cationic photoinitiator selected from the group of the iodonium or sulfonium salts. Such compounds are described, inter alia, in "UV-Curing, Science and Technology" (Editor: S. P. Pappas, Technology Marketing Corp., 642 Westover Road, Stanford, Conn., USA).

Sulfoxonium salts may also be used as radiation-sensitive compounds. Such salts are disclosed, inter alia, in EP-B 35 969 or in EP-A 44 274 and EP-A 54 509. Aliphatic sulfoxonium salts which absorb in the deep UV range merit particular mention.

It is also possible to use the sulfonic acid esters disclosed, inter alia, in U.S. Pat. No. 5 118 582, U.S. Pat. No. 5189 402 and T. Ueno et al., Polym. Eng. Sci. 32, 1511–1515 (1992). Further sulfonic acid esters are also suitable, typically the N-sulfonyloxyimides disclosed in EP-A 502 677 or the nitrobenzylsulfonates disclosed in U.S. Pat. No. 5 135 838. Other suitable sulfonyl compounds are listed in DE-A 4 225 422 and in A. E. Novembre et al., Polym. Eng. Sci. 32, 1476–1480 (1992).

For irradiation with short-wave UV radiation, however, disulfone compounds, typically phenylcumyl disulfone and phenyl-(4-anisyl)disulfone, are particularly preferred. Suitable disulfones are disclosed, inter alia, in DE-A 3 804 316.

The iminosulfonates disclosed, inter alia, in EP-A 241 423 and EP-A 571 330, are also particularly suitable.

It is also possible to use further compounds which generate sulfonic acids when exposed to actinic light. Such compounds are known per se and disclosed, inter alia, in GB-A 2 120 263, in EP-A 84 515, 37 152 or 58 638 and in U.S. Pat. Nos. 4,258,121 or 4,371,605. Compounds that generate caboxylic acid when exposed to irradiation can also be used. Such compounds are disclosed, inter alia, in EP-A 552 548.

If a salt is used as radiation-sensitive acid-degradable component b), then said salt is preferably soluble in organic solvents. Such salts are preferably salts of acids having complex anions, for example tetrafluoroboric acid, hexafluorophosphoric acid, trifluoro-methanesulfonic acid, hexafluoroarsenic acid or hexafluoroantimonic acid.

Component b) is conveniently used in an amount of 0.1–20 % by weight, preferably 0.1–15 % by weight and, most preferably, 0.2–10 % by weight, based on the total amount of components a), b) and c).

The novel formulations may contain the following additional modifiers as component c):

an organic compound whose solubility in an aqueous alkaline developer is greatly increased by treatment with an acid and which contains at last two groups that are removable with a strong acid, conveniently in an amount of 5–30 % by weight, based on the total amount of components a), b) and c) in the resist formulation. Organic compounds that contain acid-labile groups, preferably tert-alkyl ether, tert-alkyl ester, acetals or tert-alkylcarbonates, may be exemplified by:

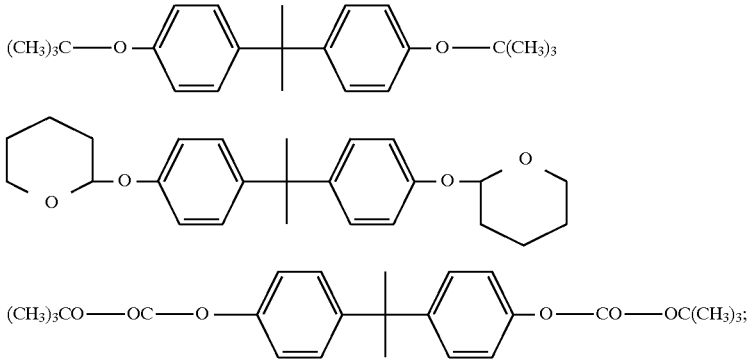

pigments or dyes in amounts of c. 0.1 to 2 % by weight, based on the total amount of components a), b) and c), typically Microlith blue 4G, Orasol blue GN and Irgalite green;

organic and inorganic fillers in amounts of c. 5 to 15 % by weight, based on the total amount of components a), b) and c), typically talcum, quartz ($SiO_2$), barium sulfate ($BaSO_4$), aluminium oxide and calcium carbonate, with which the properties of a coating, as for example the heat resistance, the adhesion, or the scratch resistance, may be enhanced;

weakly basic modifiers (lacquer additives) in a total amount of c. 01 to 10 % by weight, based on the total amount of components a), b) and c), typically antifoams (e.g. Byk 80), adhesion promoters (e.g. a benzotriazole), fungicides and thixotropic agents or hydroxy-terrminated polyglycol ethers containing ethylene oxide and/or propylene oxide units, for example Tetronic 701, 901, 908P and 1501 (products sold by BASF);

surface-active agents for enhancing the wettability of the formulation, for preventing striation on the film, for enhancing the developability of the irradiated area etc. The surface-active agents comprise nonionic surfactants such as polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate, polyethylene glycol distearate and the like; fluorine-containing surfactants such as F Top EF 301, EF 303 and EF 352 (products sold by Shin Akita Kasei K.K.), Megafac F 171 and F 173 (products sold by DAINIPPON INK & CHEMICALS), Fluorad FC 430 and FC 431 (products sold by Sumitomo 3M Limited), Asahi Guard AG 710, Surflon S-382, Surflon SC 101, SC 102, SC 103, SC 104, SC 105 and SC 106 (products sold by Asahi Glass Co., Ltd.) and the like; the organosiloxane polymer KP 341 (product sold by Shin-Etsu Chemical Co., Ltd.) and Polyflow No. 75 and No. 95 (products sold by Kyoeisha Yushikagaku Kogyo K.K.), which are acrylic or methacrylic acid polymers, and the like. The amount of surface-active agent employed is 0.01–0.1 % by weight, based on the total amount of components a), b) and c);

more strongly basic modifiers such as aromatic or aliphatic amines, ammonium salts or nitrogen-containing heterocyclic compounds, usually in a concentration of 0.01 to 1 % by weight, based on the total amount of components a), b) and c). Illustrative examples of such basic modifiers are 2-methylimidazole, trusopropylamine, 4-dimethylaminopyridine and 4,4'-diaminodiphenylether.

It is preferrred to use an aliphatic or aromatic amine as component c).

The choice of the organic solvent suitable for use as component d) in which components a), b) and c) are dissolved, and the concentration, will depend mainly on the nature of the composition of the resist formulation and on the coating method. The solvent must be inert, i.e. it may not react chemically with components a), b) and c), and it must be possible to remove it in the drying step after coating. Suitable solvents are typically ketones, ethers, esters and aromatic compounds, as well as mixtures thereof, typically methyl ethyl ketone, isobutyl methyl ketone, cyclopentanone, cyclohexanone, N-methyl-pyrrolidone, dioxane, tetrahydrofuran, 2-methoxyethanol, 2-ethoxyethanol, as well as acetates such as butyl acetate; also 1-methoxy-2-propanol, 1,2-dimethoxyethane, diethylene glycol dimethyl ether, butyl glycol, alkylene glycol monoalkyl ethers such as ethyl cellosolve, ethylene glycol monobutyl ether and methyl cellosolve, alkylene glycol alkyl ether-esters such as methyl cellosolve acetate, ethyl cellosolve acetate, propylene glycol ethyl ether acetate and methoxypropyl acetate; ethyl acetate, n-butyl acetate, ethyl 3-ethoxypropionate, as well as methoxymethyl propionate, ethyl lactate, toluene and xylenes. Preferred organic solvents are ethyl lactate, ethoxyethyl propionate and, more particularly, methoxypropyl acetate.

The novel resist formulations are conveniently prepared by mixing components a) to d) by stirring at room temperature to give a homogeneous solution.

The resist formulation is uniformly coated on the substrate by known coating techniques at room temperature, conveniently by dipping, knife coating, brushing, spraying, especially by electrostatic spraying and reverse roller coating and, preferably, by spin-coating.

The add-on (layer thickness) and the type of substrate are dependent on the desired field of application. The layer thickness is in the range from 0.1 to more than 10 μm, preferably from 0.5 to 2.0 μm.

In microelectronics the preferred substrate is a surface-oxidised silicon wafer.

After coating, the solvent will usually be removed by drying, conveniently in the temperature range from 70° to 130° C.

The resist film is a photopolymer composition which, after drying, has high photosensitivity, is not subject to autocatalytic decomposition (which is entirely surprising in view of the free phenolic groups that are known to be a problem in autocatalysis), and has very good adhesion to the substrate. Furthermore, the resist film has high transparency and sensitivity, even in the wavelength range of 190 to 300 nm, and has good thermal stability.

To produce relief structures the substrate coated with the novel formulation is exposed imagewise. The expression "imagewise" exposure will be understood as meaning not only exposure through a photomask that contains a predetermined pattern, for example a photographic transparency, but also exposure with a laser beam that is moved by computer control over the surface of the coated substrate to produce an image, irradiation with computer-controlled electron beams, as well as exposure with X-ray or UV radiation through an appropriate mask.

Exposure is normally carried out with UV and/or VIS radiation, preferably in the wavelength range from c. 190 to 1000 nm, more particularly from 190 to 300 nm and, most preferably, at 250 nm. All known standard sources of radiation can be used for exposure, typically including mercury high-pressure lamps or UV/VIS lasers and, preferably, excimer lasers (KrF excimer laser light of 248 nm wavelength). It is also possible to use X-rays (e.g. synchrotron rays) or beams of charged particles (e.g. electron beams) and the like as radiation source. The process parameters such as exposure time and distance from the radiation source and radiation-sensitive layer will usually depend on the type of radiation-sensitive formulation and on the desired properties of the coating, and can be determined by the person skilled in the art by routine experimentation.

After imagewise exposure, the wafer may be subjected to a post-exposure bake at 50°–150° C. for a few seconds to a few minutes.

Subsequently the exposed areas of the photoresist washed out with a developer. The choice of developer will depend on the type of photoresist, in particular on the nature of the binder employed or of the resultant photolysis products. The developer may comprise aqueous solutions of bases to which organic solvents or mixtures thereof may be added.

The novel formulations are preferably used as positive photoresists. A further object of the invention is therefore a process for the production of relief structures, which process comprises the following process steps in the indicated sequence:

1. applying a layer consisting of a formulation as described above to a substrate;
2. imagewise exposure of the coating with actinic radiation;
3. treating the coating with a developer consisting of an aqueous alkaline solution until the areas subjected to radiation are washed out.

Particularly preferred developers are the aqueous alkaline solutions also used for developing diazonaphthoquinone/novolak resist coatings. These solutions typically include solutions of alkali metal silicates, alkali metal phosphates, alkali metal hydroxides and alkali metal carbonates, but preferably tetraalkylammonium hydroxide solutions such as tetramethylammonium hydroxide solution. To these solutions may be added minor amounts of wetting agents and/or organic solvents. Typical organic solvents that may be added to the developer fluids include cyclohexanone, 2-ethoxyethanol, toluene, acetone, isopropanol, ethanol, as well as mixtures of two or more of these solvents.

The application of the developer is preferably effected by immersing the coated and imagewise exposed substrate in the developer solution, by spraying the developer solution on to the substrate, or by repeatedly applying and spin-coating the developer on to the coated and imagewise exposed substrate.

The invention is illustrated by the following non-limitative Examples.

EXAMPLE 1

N-(2-Hydroxybenzyl)methacrylamide 16.36 g (132.8 mmol) of 2-hydroxybenzylamine are dissolved in 133 ml of 1.0N NaOH and the solution, together with 40 ml of ethyl acetate, is cooled on an ice bath. A solution of 13.89 g (132.8 mmol) of methacryloyl chloride in 80 ml of ethyl acetate is slowly added dropwise to this mixture. After the dropwise addition, the reaction mixture is stirred for half an hour at room temperature and the organic phase is separated. The aqueous phase is extracted with ethyl acetate. The combined ethyl acetate phases are washed first with dilute HCl, then with dilute sodium hydrogencarbonate solution and then with water until the washings run neutral, separated and dried. The organic phase is concentrated to leave a viscous, slightly brownish-red reaction product that crystallises rapidly. For purification, the crude product is dissolved in ethanol and precipitated by addition of water, finally giving 19.05 g (75.0 %) of the product in the form of almost colourless crystal needles.

m.p.=103° C. (DSC, 10°/min)

$R_f$ (hexane/ethyl acetate: 3/1)=0.19

$^1$H-NMR (acetone $d_6$)δ[ppm]=1.98 t ($CH_3$, 3H); 4.42 d ($CH_2$, 2H); 5.46 s, 5.88 s ($CH_{2vin.}$, 2H); 6.30 m, 7.16 m ($H_{aromat.}$4H); 8.31 broad (OH, 1H); 9.75 (NH, 1H)

FT-IR (Nujol)$\lambda^{-1}$ [$cm^{-1}$]=1595 (v,C=C); 1649 (v,C=O); 3360 (v,O—H); 3375 (v,N—H).

EXAMPLE 2

N-(3-Hydroxybenzyl)methacrylamide 19.65 g (159.5 mmol) of 3-hydroxybenzylamine are dissolved in 160 ml of 1.0N NaOH and 50 ml of ethyl acetate are added to the the solution. A solution of 16.68 g (159.5 mmol) of methacryloyl chloride in 100 ml of ethyl acetate is slowly added dropwise to the above mixture. The further procedure and purification of the crude product is carried out as described in Example 1, giving 22.33 g (73.2 %) of product in the form of colourless crystal flakes.

m.p.=85° C. (DSC, 10°/min)

$R_f$ (hexane/ethyl acetate: ½)=0.59

$^1$H-NMR (acetone d$_6$)δ[ppm]=1.95 t (CH$_3$, 3H); 4.38 d (CH$_2$, 2H); 5.35 s, 5.76 s (CH$_{2vin.}$, 2H); 6.74 m, (H$_{aromat.2,4,6}$, 3H); 7.12 t (H$_{aromat.5}$, 3H); 7.67 broad (OH, 1H);

8.30 (NH, 1H)

FT-IR (Nujol)λ$^{-1}$[cm$^{-1}$]=1590 (v,C=C); 1659 (v,C=O); 3360 (v,O—H); 3390 (v,N—H).

EXAMPLE 3

N-(4-Hydroxybenzyl)methacrylamide 36.0 g (225.5 mmol) of 4-hydroxybenzylamine hydrochloride are dissolved in 225 ml of 2.0N NaOH and the solution, together with 70 ml of ethyl acetate, is cooled on an ice bath. A solution of 23.58 g (225.5 mmol) of methacryloyl chloride in 100 ml of ethyl acetate is slowly added dropwise to the above mixture. When the dropwise addition is complete, the reaction mixture is stirred at room temperature for half an hour and the organic phase is separated. The weakly alkaline aqueous phase is neutralised with HCl and extracted with ethyl acetate. The ethyl acetate phase is washed with water until the washings run neutral, separated, and dried. The ethyl acetate phase is concentrated, giving almost colourless crystals of the crude product. For purification, the crude product is recrystallised from diethyl ether, giving finally 26.82 g (62.2 %) of product in the form of colourless crystal flakes.

m.p.=98.0° C.

$R_f$(hexane/ethyl acetate: ½)=0.54.

$^1$H-NMR (acetone d$_6$)δ[ppm]=1.92 t (CH$_3$, 3H); 4.33 d (CH$_2$, 2H); 5.31 s, 5.72 s (CH$_{2vin.}$, 2H); 6.75 d, (H$_{aromat.3,5}$, 2H); 7.13 d (H$_{aromat.1,6}$, 2H); 7.61 broad (OH, 1H);

8.27 (NH, 1H)

FT-IR (KBr)λ-1[cm$^{-1}$]=1542, 1591 (v,C=C); 1655 (v,C=O); 3152 (v,O—H); 3363 (v,N—H).

EXAMPLE 4

Terpolymer of 4-(2-tetrahydropyranyloxy)styrene, N-(2-hydroxybenzyl)-methacrylamide and methacrylic acid.

In a 100 ml round-bottomed flask, 7.38 g (36.1 mmol) of 4-(2-tetrahydropyranyloxy)-styrene, 3.76 g (19.7 mmol) of N-(2-hydroxybenzyl)methacrylamide of Example 1, 0.85 g (9.9 mmol) of methacrylic acid and 107 mg (0.66 mmol) of α,α'-azoisobutyronitrile (AIBN) are dissolved in 22.5 ml of 2-butanone. The degassed solution is stirred for 24 hours at 70° C. and then poured into a mixture of 250 ml of methanol, 50 ml of water and 50 ml of hexane to precipitate the product. The precipitated polymer is slurried in the precipitant mixture, filtered with suction and finally dried. The polymer is then dissolved in a mixture of 30 ml of 2-butanone and 10 ml of tert-butylmethyl ether and precipitated by stirring the solution into a mixture of 200 ml of hexane and 20 ml of toluene, giving 7.5 g (62.6 %) of the polymer in the form of a colourless powder.

GPC (with polystyrene as standard): Mn=12490; Mw=29850; PD (polydispersity)=2.40

TGA (10°/min): 26.10 % weight loss in the range 160°–210° C.

DSC (10°/min): endotherms in the range 160°–210° C.

extinction at 250 nm per gm film thickness: 0.14 acid content (titration with 0.1N NaOH): 0.948 mol/kg

FT-IR (Nujol)λ$^{-1}$[cm$^{-1}$]=1508 (v,C=C); 1609 (v,C=C); 1628 (v,C=O); 1699, 1728 (v,C=O); 3377 (v,N—H).

Table 1 lists further terpolymers of the monomers A, B and C with different monomer ratios synthesised in general accordance with Example 4.

TABLE 1

| Example | Monomer weight [g (mmol)] | AIBN$^a$ [mg] | MEK$^b$ [ml] | Yield [g (%)] | Acid c [mol/kg] | E$_{250}$$^d$ [µm$^{-1}$] | Mw | PD | Tg$^e$ | % Δm/°C.$^f$ |
|---|---|---|---|---|---|---|---|---|---|---|
| 5 | A = 23.24 (113.8) B = 4.66 (24.3) C = 2.09 (24.3) | 262 | 56 | 16.7 (55.7) | 0.968 | | 29380 | 2.53 | 154 | 30.75/185 |
| 6 | A = 7.11 (34.8) B = 3.84 (20.1) C = 1.03 (12.0) | 108 | 22,5 | 7.7 (64.2) | 1.103 | | 31690 | 5.95 | >150 | 26.26/181 |
| 7 | A = 5.06 (24.8) B = 4.22 (22.1) C = 0.71 (8.2) | 89 | 18.8 | 6.1 (61.0) | 0.889 | 0.14 | 38840 | 2.43 | >155 | 23.23/189 |

A: 4-(2-tetrahydropyranyloxy)styrene
B: N-(2-hydroxybenzyl)methacrylamide
C: methacrylic acid TABLE 1-continued

| Ex- ample | Monomer weight [g (mmol)] | AIBN[a] [mg] | MEK[b] [ml] | Yield [g (%)] | Acid c [mol/kg] | $E_{250}$[d] [$\mu m^{-1}$] | Mw | PD | Tg[e] | % Δm/°C.[f] |
|---|---|---|---|---|---|---|---|---|---|---|

PD: polydispersity (Mw/Mn)
[a] α,α'-azoisobutyronitrile
[b] 2-butanone (methyl ethyl ketone)
[c] acid content of the polymer (titration of the polymer in tetrahydrofuran against 0.1 NNaOH)
[d] extinction at 250 nm per μm film thickness
[e] DSC (10°/min): glass transition temperature(only detectable in polymer 5; masked in polymers 6 and 7 by the decomposition isotherm that begins at c. 160° C.)
[f] TGA (10°/min): peak maximum of mass loss in % at the corresponding temperature in °C.

EXAMPLE 8

Terpolymer of 4-(2-tetrahydropyranyloxy)styrene, N-(3-hydroxybenzyl)-methacrylamide and methacrylic acid In accordance with the general procedure described in Example 4, 8.8 g (58.7 %) of a colourless powder are obtained from 9.19 g (45.0 mmol) of 4-(2-tetrahydropyranyloxy)-styrene, 4.69 g (24.5 mmol) of N-(3-hydroxybenzyl)methacrylamide according to Example 2, 1.06 g (12.3 mmol) of methacrylic acid and 134 mg (0.66 mmol) of AIBN in 28 ml of 2-butanone.

GPC (with polystyrene as standard): Mn=11980; Mw=30920; PD=2.58

TGA (10°/min): 25.41 % weight loss in the range 160°–210° C.

DSC (10°/min): endotherms in the range 160°–210° C.

EXAMPLE 9 tert-Butyl (4-vinylphenoxy)acetate

In a 1500 ml sulfonation flask, 135.6 g (1.13 mol) of 4-hydroxystyrene and 220.2 g (1.13 mol) of tert-butyl bromoacetate are dissolved in 800 ml of acetone and to the solution are added 195.0 g (1.41 mol) of potassium carbonate and 0.8 g of potassium iodide. The resultant suspension is stirred for 4 hours at 60° C. bath temperature. After cooling, the inorganic salts are removed by filtration and the filtrate is concentrated. The oily residue is taken up in 1000 ml of diethyl ether, washed twice with 800 ml of 1.0N sodium hydroxide solution and then three times with 1000 ml of water. The organic phase is separated, dried over magnesium sulfate and concentrated, giving 246.5 g of the desired product as a clear oil (93.2 %).

$R_f$ (hexane/ethyl acetate: 6/1)=0.53

$^1$H-NMR (CDCl$_3$)δ[ppm]=1.47 s (CH$_3$, 9H); 4.51 s (CH$_2$, 2H); 5.13 d (CH$_{vin.}$, 1H); 5.61 d (CH$_{vin.}$, 1H); 5.62 dd (CH$_{vin.}$, 1H); 6.86 d (H$_{aromat.}$,2H); 7.34 d (H$_{aromat.}$,2H).

FT-IR (KBr)$\lambda^{-1}$ (cm$^{-1}$]=1510, 1609 (v,C=C); 1747 (v,C=O).

EXAMPLE 10

Copolymer of N-(2-hydroxybenzyl)methacrylamide and tert-butyl (4-vinylphenoxy)acetate In a 200 ml round-bottomed flask, 7.03 g (30.0 mmol) of tert-butyl (4-vinylphenoxy)ace-tate, 17.21 g (90.0 mmol) of N-(2-hydroxybenzyl)methacrylamide, 0.39 g (2.4 mmol) of α,α'-azoisobutyronitrile (AIBN) and 0.24 g (1.2 mmol) of 1-dodecylmercaptan (DDM) are dissolved in 73 ml 2-butanone. The degassed solution is stirred for 16 hours at 70° C. and then precipitated by pouring it into a mixture of 300 ml of methanol and 300 ml of The polymer is collected, dried and dissolved in 80 ml of 2-butanone, and then precipitated by pouring the solution into a mixture of 600 ml of hexane and 60 ml of 2-propanol. The polymer is isolated by suction filtration and dried, giving 16.5 g (66.0%) of the polymer in the form of a colourless powder.

GPC (with polystyrene as standard): Mn =7770; Mw=15500; PD=1.99

TGA (10°/min): 7.81 % weight loss in the range 175°–190° C.

DSC (10°/min): 170°–195° C.

extinction at 250 nm per mm of film thickness: 0.15.

Table 2 lists further co- and terpolymers of the monomers A', B and C' with different monomer ratios of B and C' synthesised in general accordance with Example 2.

TABLE 2

| Ex. | Monomer weight [g (mmol)] | AIBN[a] [mg] | DDM[b] [mg] | MEK[c] [ml] | Yield [g (%)] | Mw | PD | Δm %/°C.[d] |
|---|---|---|---|---|---|---|---|---|
| 11 | A' = 7.63 (30.0) B = 13.77 (72.0) C' = 3.44 (18.0) | 394 | 243 | 73 | 17.66 (72.9) | 18120 | 2.65 | 7.76/183.0 |
| 12 | A' = 7.03(30.0) B = 10.33 (54.0) C' = 6.88 (36.0) | 394 | 243 | 73 | 17.01 (70.2) | 16130 | 2.61 | 8.39/183.0 |
| 13 | A' = 7.03 (30.0) B = 8.61 (45.0) C' = 8.61 (45.0) | 394 | 243 | 73 | 17.93 (74.0) | 17880 | 2.48 | 7.53/181.2 |
| 14 | A' = 7.03 (30.0) B = 6.88 (36.0) C' = 10.33 (54.0) | 394 | 243 | 73 | 16.0 (66.0) | 16910 | 2.46 | 7.73/181.2 |

TABLE 2-continued

| Ex. | Monomer weight [g (mmol)] | AIBN[a] [mg] | DDM[b] [mg] | MEK[c] [ml] | Yield [g (%)] | Mw | PD | Δm %/°C.[d] |
|---|---|---|---|---|---|---|---|---|
| 15 | A' = 7.03 (30.0) B = 3.44(18.0) C' = 13.77 (72.0) | 394 | 243 | 73 | 15.30 (63.1) | 16790 | 4.26 | 8.30/179.3 |
| 16 | A' = 7.63 (30.0) C' = 17.21 (90.0) | 394 | 243 | 73 | 16.68 (68.8) | 13660 | 2.75 | 8.27/177.5 |

A': tert-butyl (4-vinylphenoxy)acetate
B: N-(2-hydroxybenzyl)methacrylamide
C': N-(3-hydroxybenzyl)methacrylamide
[a]α,α'-azoisobutyronitrile
[b]n-dodecylmercaptan
[c]2-butanone (methyl ethyl ketone)
[d]TGA (10°/min): peak maximum of mass loss in % at the corresponding temperature in °C.

EXAMPLE 17

A resist solution is prepared by dissolving 2.65 g of the polymer of Example 4 and 54 mg of phenylcumyl disulfone in 12.3 g of methoxypropyl acetate. The solution is filtered through a filter having a pore width of 0.2 gm and spin-coated at 4500 rpm on to a 4 inch silicon wafer. After drying on a heating plate at 105° C. for 60 s, the resultant film has a layer thickness of 785 nm. The coated silicon wafer is exposed imagewise through a mask with KrF excimer laser light of wavelength 248 nm at an intensity of 65 mJ/cm$^2$ (projection exposure). Afterwards the wafer is given a post-exposure bake for 60 s at 80° C. and then developed by immersion in an aqueous 2.38 % solution of tetramethylammonium hydroxide for 60 s. The exposed areas of the resist film are dissolved, whereas the unexposed zones remain. The resist permits a resolution of 0.35 gm structures (equidistant lines/interspaces) with approximately vertical wall profiles. The profiles exhibit no T-shaped denaturing.

EXAMPLE 18

A resist solution is prepared by dissolving 25.52 g of the polymer of Example 4, 8.80 g of 2,2-bis(4-tetrahydopyranyloxyphenyl)propane and 0.88 g of phenyl-curnyl disulfone In 124.80 g of methoxypropyl acetate. The solution Is filtered and applied as described in Example 17. The layer thickness of the photoresist film after spin-coating (4100 rpm) and drying is 860 nm. The coated wafer is exposed at an intensity of 44 mJ/cm$^2$, given a post-exposure bake for 60 s at 75° C and developed with a 2.38 % solution of tetramethylammonium hydroxide for 60 s. The resist permits a resolution of 0.35 μm structures (equidistant lines/interspaces) with approximately vertical wall profiles. The profiles exhibit no T-shaped denaturing.

EXAMPLE 19

A resist solution is prepared by dissolving 3.53 g of the polymer of Example 7 and 72 mg of phenylcumyl disulfone in 16.4 g of methoxypropyl acetate. The solution is filtered and applied as described in Example 17. The layer thickness of the photoresist film after spin-coating (6700 rpm) and drying is 785 nm. The coated wafer is exposed through a mask with KrF excimer laser light of wavelength 248 nm at an intensity of 50 mJ/cm$^2$ and developed with a 1.19 % solution of tetramethylammonium hydroxide for 60 s. The resist permits a resolution of 0.35 μm structures (equidistant lines/interspaces) with approximately vertical wall profiles. The profiles exhibit no T-shaped denaturing.

EXAMPLE 20

3.00 g of the polymer of Example 10 and 93 mg of phenylcumyl disulfone are dissolved in 14.09 g of methoxypropyl acetate. After microfiltration through a filter having a pore width of 0.2 mm, the resultant solution is spin-coated on to a 4 inch silicon wafer such that, after drying for 60 seconds at 110° C. on a heating plate, a film with a layer thickness of 770 nm remains. Exposure is made on a contact exposure device with a mercury medium-pressure lamp through a neutral wedge mask with added 256 nm interference filter. After exposure, the specimen is given a post-exposure bake for 60 seconds on a heating plate to 130° C. and developed for 60 seconds with a 2.38 % solution of tetramethylammonium hydroxide. To determine the solubility rate in the unexposed area (2.2 A/s), the layer thickness in the area covered by the mask is determined. The exposure energy for complete development (sensitivity) is 25.5 mJ/cm$^2$.

In accordance with the general procedure described in Example 20, further resist formulations (Examples 21–24) are prepared with the polymers of Examples 11 to 14 (Table 2). The solubility rates and the intensities are summarised in Table 3.

TABLE 3

| Example | Polymer (Example No) | Sensitivity [mJ/cm2] | Solubility rate [Å/s] |
|---|---|---|---|
| 20 | 10 | 25.5 | 2.2 |
| 21 | 11 | 22.8 | 6.0 |
| 22 | 12 | 12.7 | 16.3 |
| 23 | 13 | 12.7 | 23.6 |
| 24 | 14 | 11.4 | 31.8 |

What is claimed is:
1. A resist formulation comprising
   a) 45 to 99.9% by weight of a polymer having a molecular weight of $10^3$ to $10^{6,}$ determined by gel permeation chromatography, comprising, based on the total amount of structural units present in the polymer, 90 to 10 mol % of the structural repeating unit of the formula Ia

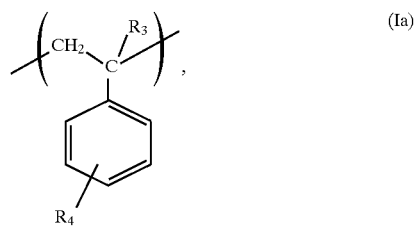

90 to 10 mol % of the structural repeating unit of the formula 1b

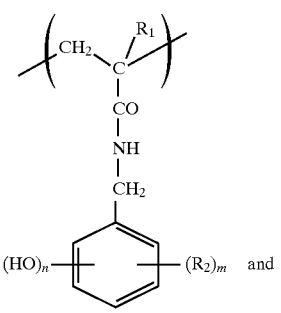

0 to 40 mol % of the structural repeating unit of the formula Ic

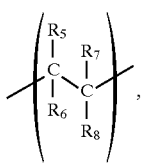

wherein $R_1$ is H, $C_1$–$C_4$ alky, halo-$C_1$–$C_4$ alkyl, halogen or CN, $R_2$ is independently H, $C_1$–$C_4$ alky, $C_1$–$C_4$ alkoxy or halogen, $R_3$ is H or $CH_3$, $R_4$ is a group containing an acid-removable O—C— or O—Si bond, $R_5$ is H or $CH_3$, $R_6$ is H, COOH or CN, $R_7$ is H or $CH_3$, $R_8$ is H, CN, COOH, $COOR_{10}$ or aryl, $R_{10}$ is $C_1$–$C_6$ alkyl n is 1, 2 or 3, and m is 0, 1, 2 or 3, and the sum of the percentages is always 100%, b) 0.1 to 20% by weight of a photoactive compound (acid generator), c) 0.01 to 40% by weight of optional modifiers, and d) an organic solvent, the percentages by weight being based on the total weight of solids a), b) and c) in the resist formulations.

2. A resist formulation according to claim 1 comprising, based on the total amount of structural units present in the polymer, 90 to 20 mol % of the structural repeating unit of formula Ia, 80 to 10 mol % of the structural repeating unit of formula Ib, and 0 to 30 mol % of the structural repeating unit of formula Ic, the sum of the percentages being always 100%.

3. A resist formulation according to claim 1, wherein $R_1$ is $CH_3$, $R_2$ is H, $CH_3$, $OCH_3$, Cl or Br, $R_3$ is H, $R_4$ is a group containing an acid-removable O—C— or O—Si bond of formula

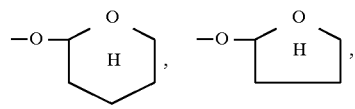

$-OC(CH_3)_2-OCH_3$ or $-OCH(CH_3)-OC_2H_5$, aralkoxy, allyloxy, $C_3$–$C_6$alkoxy or the group of formula $-O-Si(R_{11})_3$, wherein $R_{11}$ is $C_1$–$C_4$alkyl, or $R_4$ is a group of formula $-(CR'_2)_p-COO-R_9$ or $-O-(CR'_2)_p-COO-R_9$, wherein $R_9$ is an acid-removable protective group, typically aralkyl, allyl or branched $C_3$–$C_6$ alkyl, $R_5$ is H, $R_6$ is H, $R_7$ is $CH_3$, $R_8$ is COOH, R' is H or $CH_3$, p is 0 or 1, n is 1, and m is 0.

4. A resist formulation according to claim 3, wherein $R_4$ is a group of formula

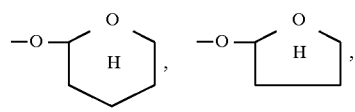

$-OC(CH_3)_2OCH_3$ or $-OCH(CH_3)OC_2H_5$.

5. A resist formulation according to claim 1, wherein $R_1$ is $CH_3$, $R_3$ is H, $R_5$ is H and $R_6$ is H, $R_7$ is $CH_3$, $R_8$ is COOH, n is 1 and m is 0, and $R_4$ is a group of the formula

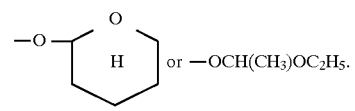

* * * * *